US012640540B2

(12) United States Patent
Agatuma

(10) Patent No.: US 12,640,540 B2
(45) Date of Patent: May 26, 2026

(54) SURFACE EMITTING LASER

(71) Applicant: SONY SEMICONDUCTOR SOLUTIONS CORPORATION, Kanagawa (JP)

(72) Inventor: Shinichi Agatuma, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 749 days.

(21) Appl. No.: 17/906,182

(22) PCT Filed: Mar. 10, 2021

(86) PCT No.: PCT/JP2021/009661
§ 371 (c)(1),
(2) Date: Sep. 12, 2022

(87) PCT Pub. No.: WO2021/187282
PCT Pub. Date: Sep. 23, 2021

(65) Prior Publication Data
US 2023/0112925 A1 Apr. 13, 2023

(30) Foreign Application Priority Data
Mar. 19, 2020 (JP) ................................. 2020-048988

(51) Int. Cl.
*H01S 5/183* (2006.01)
*H01S 5/042* (2006.01)
(52) U.S. Cl.
CPC ........ *H01S 5/18341* (2013.01); *H01S 5/0421* (2013.01); *H01S 5/04256* (2019.08);
(Continued)

(58) Field of Classification Search
CPC ............... H01S 5/18341; H01S 5/0421; H01S 5/04256; H01S 5/18311; H01S 5/18347;
(Continued)

(56) References Cited

U.S. PATENT DOCUMENTS

| | | | | |
|---|---|---|---|---|
| 2002/0036295 A1* | 3/2002 | Nunoue | ............. | H10H 20/8142 257/E33.068 |
| 2014/0023102 A1* | 1/2014 | Holder | .................. | H01S 5/0654 372/44.01 |

(Continued)

FOREIGN PATENT DOCUMENTS

| | | |
|---|---|---|
| JP | 08-204037 A | 8/1996 |
| JP | 11-046038 A | 2/1999 |

(Continued)

OTHER PUBLICATIONS

International Search Report and Written Opinion of PCT Application No. PCT/JP2021/009661, issued on May 18, 2021, 12 pages of ISRWO.

*Primary Examiner* — Xinning(Tom) Niu
(74) *Attorney, Agent, or Firm* — CHIP LAW GROUP

(57) ABSTRACT

A surface emitting laser according to one embodiment of the disclosure includes a stacked structure including, in order, a first DBR layer, an active layer, a second DBR layer, and a first electrically conductive contact layer. The stacked structure further includes a second electrically conductive contact layer and a two-dimensional electron gas generation layer between the first DBR layer and the active layer or in the first DBR layer. The surface emitting laser further includes a first electrode layer in contact with the first electrically conductive contact layer and a second electrode layer in contact with the second electrically conductive contact layer.

8 Claims, 4 Drawing Sheets

(52) U.S. Cl.
CPC ...... *H01S 5/18311* (2013.01); *H01S 5/18347*
(2013.01); *H01S 5/18377* (2013.01)

(58) Field of Classification Search
CPC ............. H01S 5/18377; H01S 5/18358; H01S
2301/176; H01S 5/04257
See application file for complete search history.

(56) References Cited

U.S. PATENT DOCUMENTS

| | | | |
|---|---|---|---|
| 2015/0194789 A1 | 7/2015 | Graham et al. | |
| 2019/0006501 A1* | 1/2019 | Yang .................. | H10D 30/4732 |
| 2020/0185882 A1* | 6/2020 | Zhao ................... | H01S 5/18361 |
| 2022/0320830 A1* | 10/2022 | Aoki .................... | H01S 5/0421 |

FOREIGN PATENT DOCUMENTS

| | | | |
|---|---|---|---|
| JP | 11-135770 | A | 5/1999 |
| JP | 2004-031669 | A | 1/2004 |
| JP | 2007-324363 | A | 12/2007 |
| JP | 2018-064061 | A | 4/2018 |
| JP | 2018-125404 | A | 8/2018 |
| JP | 2020-048988 | A | 4/2020 |

* cited by examiner

[FIG. 1]
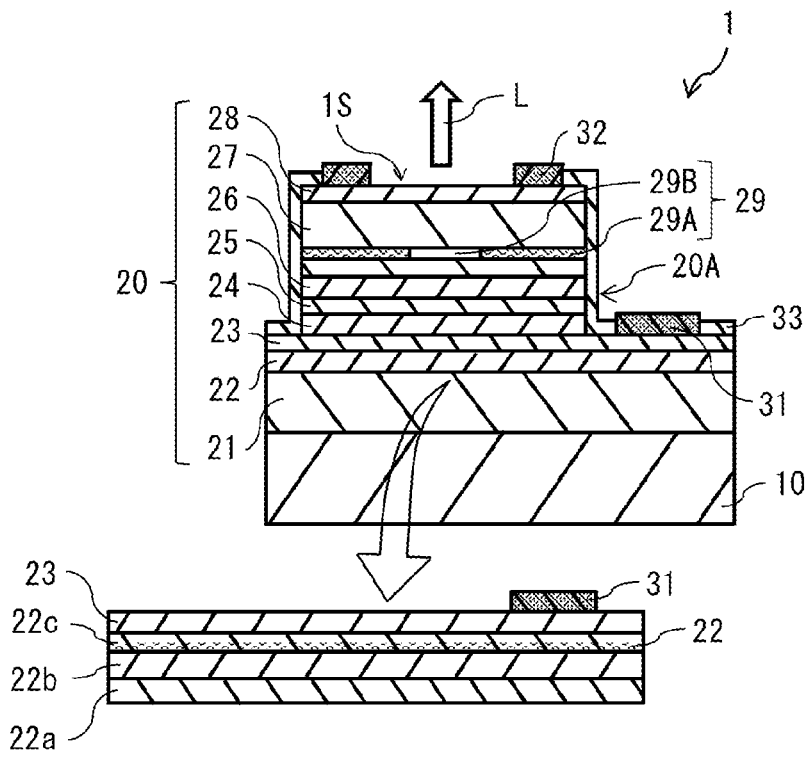
[FIG. 2]
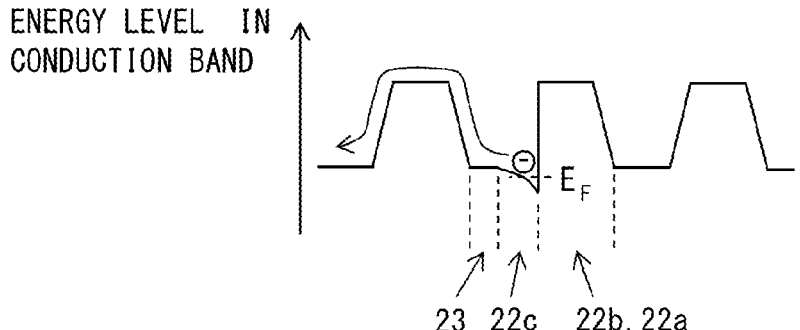

[FIG. 3]
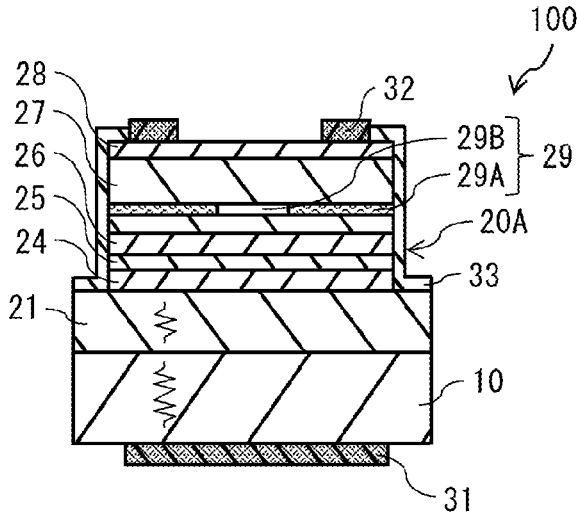
[FIG. 4]
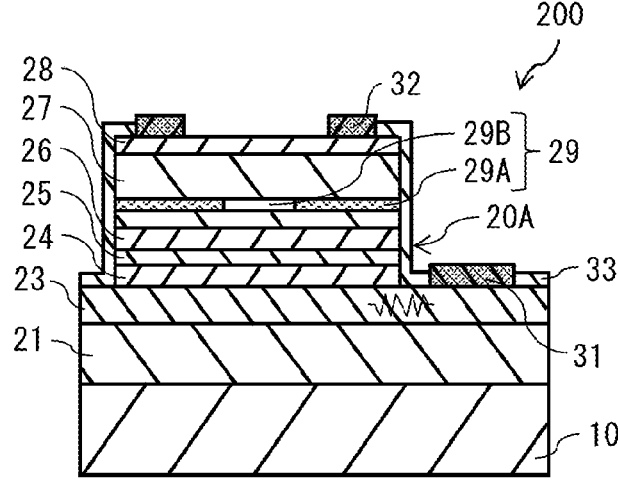

[FIG. 5]
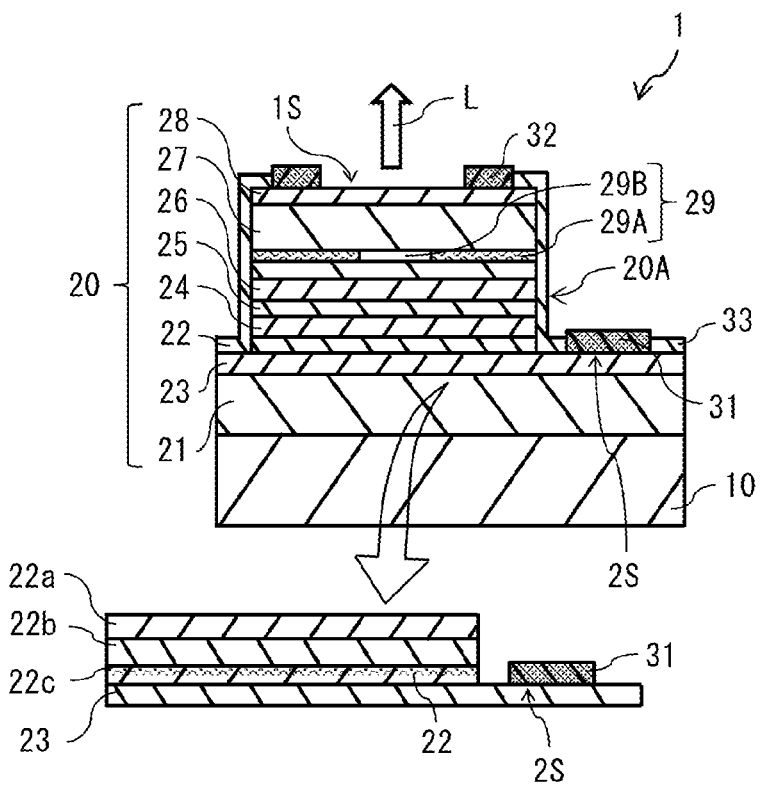
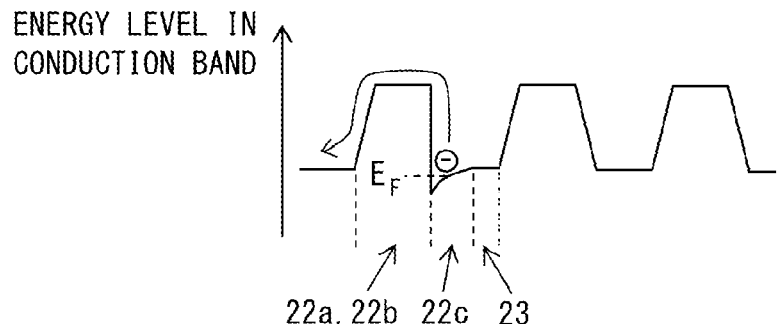
[FIG. 6]
ENERGY LEVEL IN
CONDUCTION BAND
$E_F$
22a, 22b  22c  23

[FIG. 7]
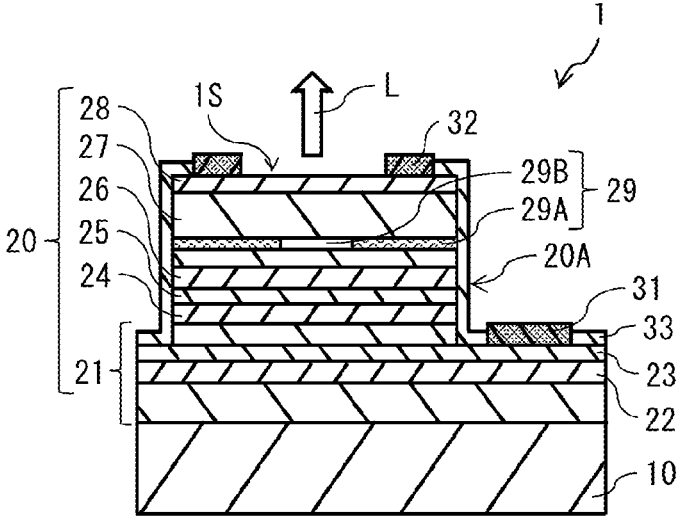
[FIG. 8]
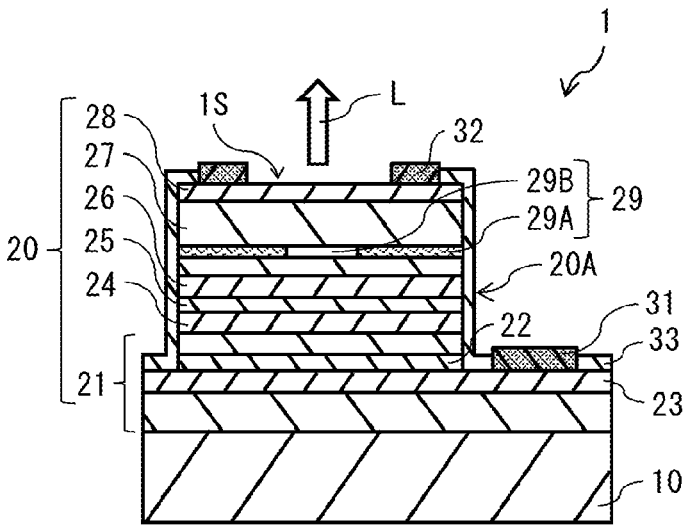

SURFACE EMITTING LASER

CROSS REFERENCE TO RELATED APPLICATIONS

This application is a U.S. National Phase of International Patent Application No. PCT/JP2021/009661 filed on Mar. 10, 2021, which claims priority benefit of Japanese Patent Application No. JP 2020-048988 filed in the Japan Patent Office on Mar. 19, 2020. Each of the above-referenced applications is hereby incorporated herein by reference in its entirety.

TECHNICAL FIELD

The disclosure relates to a surface emitting laser.

BACKGROUND

For example, Patent Literature 1 and Patent Literature 2 disclose a surface emitting laser.

CITATION LIST

Patent Literature

[PTL 1] Japanese Unexamined Patent Application Publication No. H11-046038
[PTL 2] Japanese Unexamined Patent Application Publication No. 2018-125404

SUMMARY OF THE INVENTION

There is a demand for a surface emitting laser that achieves both high optical output and low driving voltage. It is therefore desirable to provide a surface emitting laser that achieves both high optical output and low driving voltage.

A surface emitting laser according to one embodiment of the disclosure includes a stacked structure that includes, in order, a first distributed bragg reflector (DBR) layer, an active layer, a second DBR layer, and a first electrically conductive contact layer. The stacked structure further includes a second electrically conductive contact layer and a two-dimensional electron gas generation layer between the first DBR layer and the active layer or in the first DBR layer. The surface emitting laser further includes a first electrode layer in contact with the first electrically conductive contact layer and a second electrode layer in contact with the second electrically conductive contact layer.

In the surface emitting laser according to one embodiment of the disclosure, the second electrically conductive contact layer in contact with the second electrode layer reduces the driving voltage of the surface emitting laser, and the two-dimensional electron gas generation layer provided near the second electrically conductive contact layer secures transportation of carriers even in a case where the second electrically conductive contact layer is formed to be thin.

BRIEF DESCRIPTION OF DRAWINGS

FIG. 1 is a view illustrating an exemplary cross-sectional configuration of a surface emitting laser according to one embodiment of the disclosure.

FIG. 2 is a diagram illustrating an exemplary energy level in a conduction band of a two-dimensional electron gas generation layer and a layer nearby in the surface emitting laser illustrated in FIG. 1.

FIG. 3 is a view illustrating an example of a cross-sectional configuration of a surface emitting laser according to a comparative example.

FIG. 4 is a view illustrating an example of a cross-sectional configuration of a surface emitting laser according to a comparative example.

FIG. 5 is a view illustrating a modification example of the cross-sectional configuration of the surface emitting laser illustrated in FIG. 1.

FIG. 6 is a diagram illustrating an exemplary energy level in the conduction band in the two-dimensional electron gas generation layer and the layer nearby in the surface emitting laser illustrated in FIG. 5.

FIG. 7 is a view illustrating a modification example of the cross-sectional configuration of the surface emitting laser illustrated in FIG. 1.

FIG. 8 is a view illustrating a modification example of the cross-sectional configuration of the surface emitting laser illustrated in FIG. 5.

MODES FOR CARRYING OUT THE INVENTION

Hereinafter, embodiments of the disclosure are described in detail with reference to the accompanying drawings. The following description is a specific example of the disclosure, and the disclosure is not limited to the following embodiments. Further, the disclosure is not limited to the arrangement, the dimensions, the dimension ratio, and the like of each component illustrated in the respective drawings.

Embodiments

[Configuration]

A surface emitting laser 1 according to one embodiment of the disclosure will now be described. FIG. 1 illustrates an exemplary cross-sectional configuration of the surface emitting laser 1.

The surface emitting laser 1 includes a vertical resonator on a substrate 10. The vertical resonator includes two distributed bragg reflector (DBR) layers (an n-type DBR layer 21 and a p-type DBR layer 27) opposed to each other in a normal direction of the substrate 10, and is configured to oscillate at an oscillation wavelength of 20. The n-type DBR layer 21 corresponds to a specific example of a "first DBR layer" of the disclosure. The p-type DBR layer 27 corresponds to a "second DBR layer" of the disclosure. The n-type DBR layer 21 is formed at a position more adjacent to the substrate 10 than the p-type DBR layer 27 is. The p-type DBR layer 27 is formed at a position farther from the substrate 10 than the n-type DBR layer 21 is. The surface emitting laser 1 is configured to emit laser light L from the p-type DBR layer 27. The surface emitting laser 1 is thus a laser of a top emission type that has a light emitting surface 1S on its top face.

The surface emitting laser 1 includes an epitaxial stacked structure 20 on the substrate 10. The epitaxial stacked structure 20 is formed on the substrate 10 serving as a crystal growth substrate by an epitaxial crystal growth method. The epitaxial stacked structure 20 includes, for example, the n-type DBR layer 21, a two-dimensional electron gas generation layer 22, an n-type contact layer 23, a spacer layer 24, an active layer 25, a spacer layer 26, the p-type DBR layer 27, and a p-type contact layer 28 in this order from a side adjacent to the substrate 10. The n-type contact layer 23 corresponds to a specific example of a "first electrically conductive contact layer" of the disclosure. The p-type contact layer 28 corresponds to a specific example of a "second electrically conductive contact layer" of the disclosure.

At least the spacer layer 24, the active layer 25, the spacer layer 26, the p-type DBR layer 27, and the p-type contact layer 28 in the epitaxial stacked structure 20 constitute a mesa part 20A having a columnar shape extending in the normal direction of the substrate 10. The two-dimensional electron gas generation layer 22 and the n-type contact layer 23 are provided in a region adjacent to the n-type DBR layer 21 with respect to the position of the mesa part 20A. The two-dimensional electron gas generation layer 22 is opposed to at least the mesa part 20A and an electrode layer 31 with the n-type contact layer 23 interposed therebetween. The n-type contact layer 23 is formed at a position more adjacent to the active layer 25 than the two-dimensional electron gas generation layer 22 is. The two-dimensional electron gas generation layer 22 and the n-type contact layer 23 are provided between the n-type DBR layer 21 and the active layer 25. The substrate 10 is opposed to the mesa part 20A through the two-dimensional electron gas generation layer 22 and the n-type contact layer 23.

The surface emitting laser 1 includes an electrode layer 32 in contact with a top portion of the mesa part 20A (i.e., the p-type contact layer 28), and the electrode layer 31 in contact with the n-type contact layer 23 extending below a bottom portion of the mesa part 20A. The p-type contact layer 28 is a layer for an ohmic contact between the p-type DBR layer 27 and the electrode layer 32. The n-type contact layer 23 is a layer serving as a current path between the electrode layer 31 and a central portion of the mesa part 20A. The electrode layer 32 has a ring shape with an opening at least at a position opposed to a light-emitting region of the active layer 25. A surface of the n-type contact layer 23 exposed in the opening of the electrode layer 32 serves as the light emitting surface 1S. The electrode layer 31 is in contact with a portion of a surface of the n-type contact layer 23 adjacent to the active layer 25 extending around the bottom portion of the mesa part 20A (i.e., an exposed portion not covered with the mesa part 20A). The electrode layer 32 corresponds to a specific example of a "first electrode layer" of the disclosure. The electrode layer 31 corresponds to a specific example of a "second electrode layer" of the disclosure.

The surface emitting laser 1 includes, for example, an arsenide semiconductor. The arsenide semiconductor refers to a compound semiconductor that includes an arsenic (As) element and at least one element of aluminum (Al), gallium (Ga), and indium (In). The substrate 10 is, for example, an n-type semiconductor substrate. Examples of the n-type semiconductor substrate used as the substrate 10 include an n-type GaAs substrate. Alternatively, the substrate 10 may be a semi-insulating semiconductor substrate. Examples of the semi-insulating semiconductor substrate usable as the substrate 10 include a GaAs substrate. The substrate 10 may be a semi-insulating semiconductor substrate to reduce absorption of light emitted from the active layer 25. Examples of the semi-insulating semiconductor substrate usable as the substrate 10 include a semi-insulating GaAs substrate.

The n-type DBR layer 21 is formed by alternately stacking a low refractive index layer (not illustrated) and a high refractive index layer (not illustrated). In the n-type DBR layer 21, the low refractive index layer includes, for example, n-type $Al_{x1}Ga_{1-x1}As$ ($0<x1<1$) having an optical thickness of $\lambda 0 \times \frac{1}{4}$ (where $\lambda 0$ represents an oscillation wavelength), and the high refractive index layer includes, for example, n-type $Al_{x2}Ga_{1-x2}As$ ($0 \leq x2 < x1$) having an optical thickness of $\lambda 0 \times \frac{1}{4}$.

The two-dimensional electron gas generation layer 22 is so configured that electrons are allowed to be distributed two-dimensionally in the semiconductor layer. For example, in the two-dimensional electron gas generation layer 22, a barrier is formed in the conduction band at an interface between two semiconductor layers stacked on each other, and a Fermi level is located above the conduction band through an adjustment in voltage and doping. The two-dimensional electron gas generation layer 22 is formed in a stacked body that includes, for example, a non-doped GaAs layer 22c, a non-doped AlGaAs layer 22b, and an n-type AlGaAs layer 22a in this order from a side adjacent to the n-type contact layer 23. The two-dimensional electron gas generation layer 22 is formed in a stacked body formed by stacking, for example, the n-type AlGaAs layer 22a, the non-doped AlGaAs layer 22b, and the non-doped GaAs layer 22c in this order on the n-type DBR layer 21. For example, as illustrated in FIGS. 1 and 2, a barrier is formed in a conduction band of the non-doped GaAs layer 22c near the interface between the non-doped GaAs layer 22c and the non-doped AlGaAs layer 22b, and a Fermi level EF is located above the conduction band. Thus, the two-dimensional electron gas generation layer 22 is formed in the non-doped GaAs layer 22c near the interface between the non-doped GaAs layer 22c and the non-doped AlGaAs layer 22b.

The n-type contact layer 23 includes, for example, n-type GaAs. The spacer layer 24 includes, for example, n-type $Al_{x3}Ga_{1-x3}As$ ($0 \leq x3 < 1$). Examples of the n-type impurity in the n-type DBR layer 21, the n-type AlGaAs layer 22a, the n-type contact layer 23, and the spacer layer 24 include silicon (Si).

The active layer 25 has, for example, a multi-quantum well structure in which a well layer (not illustrated) including undoped $In_{x4}Ga_{1-x4}As$ ($0<x4<1$) and a barrier layer (not illustrated) including undoped $Al_{x5}Ga_{1-x5}As$ ($0 \leq x5 < 1$) are alternately stacked. It is to be noted that a region of the active layer 25 opposed to a current injection region 29B (described below) serves as a light emitting region.

The spacer layer 26 includes, for example, p-type $Al_{x6}Ga_{1-x6}As$ ($0 \leq x6 < 1$). The p-type DBR layer 27 is formed by alternately stacking a low refractive index layer (not illustrated) and a high refractive index layer (not illustrated). In the p-type DBR layer 27, the low refractive index layer includes, for example, p-type $Al_{x7}Ga_{1-x7}As$ ($0<x7<1$) having an optical thickness of $\lambda 0 \times \frac{1}{4}$, and the high refractive index layer includes, for example, n-type $Al_{x8}Ga_{1-x8}As$ ($0 \leq x8 < x7$) having an optical thickness of $\lambda 0 \times \frac{1}{4}$. Compared with the n-type DBR layer 21, the p-type DBR layer 27 has a lower refractive index with respect to an oscillation wavelength $\lambda 0$ of the vertical resonator in the mesa part 20A. The p-type DBR layer 27 is formed to be thinner than the n-type DBR layer 21, for example. The p-type contact layer 28 includes, for example, p-type $Al_{x9}Ga_{1-x9}As$ ($0 \leq x9 < 1$). Examples of the p-type impurity in the spacer layer 26, the p-type DBR layer 27, and the p-type contact layer 28 include carbon (C).

The epitaxial stacked structure 20 includes a current constriction layer 29 in the p-type DBR layer 27 or between the p-type DBR layer 27 and the spacer layer 26. The current constriction layer 29 includes the current injection region 29B and a current constriction region 29A. The current constriction region 29A is formed in a peripheral region of the current injection region 29B. The current injection region 29B includes, for example, p-type Alx10Ga1-x10As (0<x10≤1). The current constriction region 29A includes, for example, Al2O3 (aluminum oxide). The current constriction region 29A is obtained by, for example, oxidizing high-density Al included in an AlAs layer described below from a side of the AlAs layer. The current constriction layer 29 thus has a function of constricting currents.

The electrode layer 31 is in contact with a surface of the n-type contact layer 23 adjacent to the mesa part 20A. The electrode layer 31 includes an alloy. For example, the electrode layer 31 is a stacked body that includes, for example, AuGe, Ni, and Au that are stacked in order from a side adjacent to the n-type contact layer 23. The electrode layer 32 includes a non-alloy. For example, the electrode layer 32 is a stacked body that includes, for example, Ti, Pt, and Au that are stacked in order from a side adjacent to the p-type contact layer 28. An insulating layer 33 is formed around the mesa part 20A. The insulating layer 33 is a layer for protecting the mesa part 20A, and includes, for example, SiO2 or Si3N4.

Manufacturing Method

Next, a method of manufacturing the surface emitting laser 1 according to the present embodiment is described.

To manufacture the surface emitting laser 1, a compound semiconductor is collectively formed on the substrate 10 including, for example, GaAs by an epitaxial crystal growth method such as metal organic chemical vapor deposition (MOCVD). In this case, examples of the material of the compound semiconductor include a methyl-based organo-metallic gas, such as trimethylaluminium (TMAl), trimethylgallium (TMGa), or trimethylindium (TMIn), and an arsine (AsH3) gas. Examples of the material of the donor impurity include disilane (Si2H6). Examples of the acceptor impurity include carbon tetrabromide (CBr4).

First, the epitaxial stacked structure 20 that includes the n-type DBR layer 21, the two-dimensional electron gas generation layer 22, the n-type contact layer 23, the spacer layer 24, the active layer 25, the spacer layer 26, the p-type DBR layer 27, and the p-type contact layer 28 is formed on a surface of the substrate 10 by an epitaxial crystal growth method such as MOCVD.

Thereafter, a resist layer (not illustrated) having, for example, a circular shape is formed, and the epitaxial stacked structure 20 is selectively etched by using this resist layer as a mask. The epitaxial stacked structure 20 is etched to a depth reaching the n-type contact layer 23. In this case, the epitaxial stacked structure 20 is preferably etched by reactive ion etching (RIE) using a Cl-based gas, for example. The mesa part 20A having a columnar shape is thereby formed. At this time, the n-type contact layer 23 is exposed in the region around the bottom portion of the mesa part 20A. Additionally, the AlAs layer is formed in the region in which the current constriction layer 29 is to be formed, and is exposed on the side face of the mesa part 20A. Thereafter, the resist layer is removed.

Thereafter, an oxidation treatment is conducted at a high temperature in a water-vapor atmosphere to selectively oxidize Al included in the AlAs layer from the side face of the mesa part 20A. Alternatively, Al included in the AlAs layer is selectively oxidized from the side face of the mesa part 20A by a wet oxidation method. The outer peripheral region of the AlAs layer is thereby turned into an insulating layer (aluminum oxide), forming the current constriction layer 29 in the mesa part 20A.

Thereafter, the electrode layer 32 is formed so as to be in contact with the top face of the mesa part 20A (e.g., the p-type contact layer 28), and the insulating layer 33 is formed so as to cover the mesa part 20A. At this time, an opening is formed at a predetermined position in the region around the bottom portion of the mesa part 20A. Thereafter, the electrode layer 31 is formed in the opening so as to be in contact with the surface (exposed face) of the n-type contact layer 23 adjacent to the mesa part 20A. The surface emitting laser 1 is thereby manufactured.

[Operations]

In the surface emitting laser 1 having such a configuration, when a predetermined voltage is applied to between the electrode layer 31 electrically coupled to the n-type contact layer 23 and the electrode layer 32 electrically coupled to the p-type contact layer 28, a current constricted by the current constriction layer 29 is injected into the active layer 25, causing electrons and holes to recombine with each other to generate light emission. As a result, a laser oscillation at an oscillation wavelength 20 is generated by the vertical reso-nator in the mesa part 20A. Light leaked from the p-type DBR layer 27 is outputted as a beam of the laser light L from the light emitting surface 1S to outside.

[Effects]

Next, effects of the surface emitting laser 1 according to the present embodiment are described in comparison with comparative examples.

FIGS. 3 and 4 respectively illustrate examples of cross-sectional configurations of surface emitting lasers 100 and 200 according to comparative examples. In the surface emitting laser 100 illustrated in FIG. 3, the electrode layer 31 is provided on a rear surface of the substrate 10. In this case, the substrate 10 is, for example, an n-type GaAs substrate, and a laser oscillation is generated by applying a predeter-mined voltage to between the electrode layer 32 provided on the mesa part 20A and the electrode layer 31 provided on the rear surface of the substrate 10. At this time, a driving voltage is increased by a resistance component in a thickness direction of the substrate 10 and the n-type DBR layer 21.

In the surface emitting laser 200 illustrated in FIG. 4, the n-type contact layer 23 is formed to be thick. This decreases a resistance component in a lateral direction, decreasing the driving voltage. However, light absorption at the n-type contact layer 23 is caused due to the large thickness of the n-type contact layer 23, which increases a threshold current and decreases optical output.

In contrast, according to the present embodiment, the n-type contact layer 23 in contact with the electrode layer 31 decreases the driving voltage of the surface emitting laser 1, and the two-dimensional electron gas generation layer 22 provided near the n-type contact layer 23 secures transpor-tation of carriers even in a case where the n-type contact layer 23 is formed to be thin. In a case where the n-type contact layer 23 is formed to be thin, light absorption at the n-type contact layer 23 is suppressed, the threshold current is decreased, and optical output is improved. Additionally, because transportation of carriers in the lateral direction is secured due to the presence of the two-dimensional electron gas generation layer 22, the resistance component in the lateral direction is reduced, and the driving voltage is thus decreased. Accordingly, it is possible to achieve both high optical output and low driving voltage.

In the present embodiment, the n-type contact layer 23 is formed more adjacent to the active layer 25 than the two-dimensional electron gas generation layer 22 is, and the electrode layer 31 is in contact with the surface (exposed face) of the n-type contact layer 23 adjacent to the active layer 25. Accordingly, it is possible to form the mesa part 20A and at the same time the exposed face of the n-type contact layer 23 by selectively etching the epitaxial stacked structure 20 in the manufacturing process. Thus, it is possible to achieve both high optical output and low driving voltage without adding a special step to the manufacturing process.

In the present embodiment, the two-dimensional electron gas generation layer 22 includes the non-doped GaAs layer 22c, the non-doped AlGaAs layer 22b, and the n-type AlGaAs layer 22a in this order from the side adjacent to the n-type contact layer 23. The two-dimensional electron gas generation layer 22 is formed in the non-doped GaAs layer 22c near the interface between the non-doped GaAs layer 22c and the non-doped AlGaAs layer 22b. As described above, the two-dimensional electron gas generation layer 22 is formed by using the non-dope layers. Thus, light absorption at the two-dimensional electron gas generation layer 22 is suppressed, the threshold current is decreased, and the optical output is improved. Accordingly, it is possible to achieve both high optical output and low driving voltage.

MODIFICATION EXAMPLES

Modification Example A

As illustrated in FIG. 5, for example, the positional relationship between the two-dimensional electron gas generation layer 22 and the n-type contact layer 23 may be interchanged in the embodiment described above. In this case, the two-dimensional electron gas generation layer 22 is formed at a position more adjacent to the active layer 25 than the n-type contact layer 23 is, and the n-type contact layer 23 has an exposed face 2S not covered with the two-dimensional electron gas generation layer 22 at a portion of a surface adjacent to the active layer 25 and around the bottom portion of the mesa part 20A. In the epitaxial stacked structure 20, at least the spacer layer 24, the active layer 25, the spacer layer 26, the p-type DBR layer 27, and the p-type contact layer 28 constitute the mesa part 20A having a columnar shape extending in the normal direction of the substrate 10. It is to be noted that, in the example illustrated in FIG. 5, at least the two-dimensional electron gas generation layer 22, the spacer layer 24, the active layer 25, the spacer layer 26, the p-type DBR layer 27, and the p-type contact layer 28 in the epitaxial stacked structure 20 constitute the mesa part 20A having a columnar shape extending in the normal direction of the substrate 10.

In this modification example, the two-dimensional electron gas generation layer 22 is formed in the stacked body that includes, for example, the non-doped GaAs layer 22c, the non-doped AlGaAs layer 22b, and the n-type AlGaAs layer 22a in this order from the side adjacent to the n-type contact layer 23. The two-dimensional electron gas generation layer 22 is formed in the stacked body formed by stacking, for example, the non-doped GaAs layer 22c, the non-doped AlGaAs layer 22b, and the n-type AlGaAs layer 22a in this order on the n-type contact layer 23. In this modification example, as illustrated in FIGS. 5 and 6, for example, the barrier is formed in the conduction band of the non-doped GaAs layer 22c near the interface between the non-doped GaAs layer 22c and the non-doped AlGaAs layer 22b, and the Fermi level EF is located above the conduction band. Accordingly, the two-dimensional electron gas generation layer 22 is formed in the non-doped GaAs layer 22c near the interface between the non-doped GaAs layer 22c and the non-doped AlGaAs layer 22b.

In this modification example, the n-type contact layer 23 in contact with the electrode layer 31 decreases the driving voltage of the surface emitting laser 1, and the two-dimensional electron gas generation layer 22 provided near the n-type contact layer 23 secures transportation of carriers even in a case where the n-type contact layer 23 is formed to be thin, as in the embodiments described above. In a case where the n-type contact layer 23 is formed to be thin, light absorption at the n-type contact layer 23 is suppressed, the threshold current is decreased, and the optical output is improved. Additionally, because transportation of carriers in the lateral direction is secured due to the presence of the two-dimensional electron gas generation layer 22, the resistance component in the lateral direction is reduced, and the driving voltage is thus decreased. Accordingly, it is possible to achieve both high optical output and low driving voltage also in this modification example.

In this modification example, the two-dimensional electron gas generation layer 22 is formed at a position more adjacent to the active layer 25 than the n-type contact layer 23 is, and the electrode layer 31 is in contact with the portion of the n-type contact layer 23 around the bottom portion of the mesa part 20A (i.e., the exposed face 2S not covered with the two-dimensional electron gas generation layer 22). Accordingly, it is possible to form the mesa part 20A and at the same time the exposed face of the n-type contact layer 23 by selectively etching the epitaxial stacked structure 20 in the manufacturing process. Thus, it is possible to achieve both high optical output and low driving voltage without adding a special step to the manufacturing process. Further, the n-type contact layer 23 is allowed to be provided farther from the active layer 25 in this modification example than in the embodiments described above. Accordingly, it is possible to further suppress light absorption at the n-type contact layer 23.

Modification Example B

As illustrated in FIGS. 7 and 8, for example, the two-dimensional electron gas generation layer 22 and the n-type contact layer 23 may be formed in the n-type DBR layer 21 in the embodiments described above and the modification example of the embodiments. Also in this case, it is possible to achieve both high optical output and low driving voltage as in the embodiments described above and the modification example of the embodiments.

Modification Example C

In the embodiments described above and the modification examples of the embodiments, the surface emitting laser 1 is a laser of the top-emission type that emits the laser light L from the top face of the mesa part 20A; however, the surface emitting laser 1 may be a laser of a bottom-emission type that emits the laser light L from the side adjacent to the substrate 10. In this case, the substrate 10 may be omitted. For example, a lift-off layer may be provided between the substrate 10 and the epitaxial stacked structure 20, and the substrate 10 may be removed by irradiating the lift-off layer with laser light. Removing the substrate 10 eliminates light absorption losses in the substrate 10. Accordingly, it is possible to achieve both high optical output and low driving voltage.

Modification Example D

In the epitaxial stacked structure 20 according to the embodiments described above and the modification examples of the embodiments, the semiconductor layer provided on the top portion of the mesa part 20A includes the p-type semiconductor, and the semiconductor layer provided in the epitaxial stacked structure 20 adjacent to the substrate 10 includes the n-type semiconductor. However, in the epitaxial stacked structure 20 according to the embodiments descried above and the modification examples of the embodiments, the semiconductor layer provided on the top portion of the mesa part 20A may include the n-type semiconductor, and the semiconductor layer provided in the epitaxial stacked structure 20 adjacent to the substrate 10 may include the p-type semiconductor.

Modification Example E

In the embodiments described above and the modification examples of the embodiments, the surface emitting laser 1 includes the arsenide semiconductor. However, in the embodiments described above and the modification examples of the embodiments, the surface emitting laser 1 may include, for example, a III-V group semiconductor including nitrogen (N), boron (B), antimony (Sb), and phosphorous (P).

For example, in the embodiments described above and the modification examples of the embodiments, the two-dimensional electron gas generation layer 22 may be formed in the stacked body that includes, for example, the non-doped GaN layer, the non-doped AlGaN layer, and the n-type AlGaN layer in this order from the side adjacent to the n-type contact layer 23. In this case, for example, the barrier is formed in the conduction band in the non-doped GaN layer near the interface between the non-doped GaN layer and the non-doped AlGaN layer, and the Fermi level is located above the conduction band. Thus, the two-dimensional electron gas generation layer 22 is formed in the non-doped GaN layer near the interface between the non-doped GaN layer and the non-doped AlGaN layer. Accordingly, it is possible to achieve both high optical output and low driving voltage also in this modification example as in the embodiments described above and the modification examples of the embodiments.

The disclosure has been described with reference to the embodiments and the modification examples of the embodiments in the above description. The disclosure, however, should not be limited to the embodiments and the modification examples described above, and various modifications may be made. It is to be noted that the effects described herein are mere examples. Effects of the disclosure should not be limited to those described herein. The disclosure may include effects other than the effects described herein.

Further, the disclosure may have, for example, the following configurations.

(1) A surface emitting laser including:
  a stacked structure including, in order, a first distributed bragg reflector (DBR) layer, an active layer, a second DBR layer, and a first electrically conductive contact layer, the stacked structure further including a second electrically conductive contact layer and a two-dimensional electron gas generation layer between the first DBR layer and the active layer or in the first DBR layer;
  a first electrode layer in contact with the first electrically conductive contact layer; and
  a second electrode layer in contact with the second electrically conductive contact layer.
(2) The surface emitting laser according to (1), in which the second electrically conductive contact layer is formed at a position more adjacent to the active layer than the two-dimensional electron gas generation layer is,
  at least the active layer, the second DBR layer, and the first electrically conductive contact layer in the stacked structure form a mesa part having a columnar shape, and
  the second electrode layer is in contact with a surface of the second electrically conductive contact layer adjacent to the active layer.
(3) The surface emitting laser according to (1), in which
  the two-dimensional electron gas generation layer is formed at a position more adjacent to the active layer than the second electrically conductive contact layer is,
  at least the active layer, the second DBR layer, and the first electrically conductive contact layer in the stacked structure form a mesa part having a columnar shape,
  the second electrically conductive contact layer includes an exposed face not covered with the two-dimensional electron gas generation layer on a portion of a surface of the second electrically conductive contact layer adjacent to the active layer, the portion corresponding to a portion around a bottom portion of the mesa part, and
  the second electrode layer is in contact with the exposed face.
(4) The surface emitting laser according to any one of (1) to (3), in which
  the stacked structure includes a non-doped GaAs layer, a non-doped AlGaAs layer, and a second electrically conductive AlGaAs layer in this order from a side adjacent to the second electrically conductive contact layer, and
  the two-dimensional electron gas generation layer is formed in the non-doped GaAs layer near an interface between the non-doped AlGaAs layer and the non-doped AlGaAs layer.
(5) The surface emitting laser according to any one of (1) to (3), in which
  the stacked structure includes a non-doped GaN layer, a non-doped AlGaN layer, and a second electrically conductive AlGaN layer in this order from a side adjacent to the second electrically conductive contact layer, and
  the two-dimensional electron gas generation layer is formed in the non-doped GaN layer near an interface between the non-doped AlGaN layer and the non-doped AlGaN layer.

According to the surface emitting laser according to one embodiment of the disclosure, the second electrically conductive contact layer in contact with the second electrode layer decreases the driving voltage of the surface emitting laser, and the two-dimensional electron gas generation layer provided near the second electrically conductive contact layer secures transportation of carriers even in a case where the second electrically conductive contact layer is formed to be thin. Accordingly, it is possible to achieve both high optical output and low driving voltage.

This application claims the priority of Japanese Patent Application No. 2020-048988 filed with the Japanese Patent Office on Mar. 19, 2020, the entire contents of which are incorporated herein by reference.

Those skilled in the art could conceive of various modifications, combinations, sub-combinations, and changes in accordance with design requirements and other factors. However, it is understood that they are included within the scope of the appended claims or the equivalents thereof.

The invention claimed is:

1. A surface emitting laser, comprising:
a substrate;
a stacked structure includes:
    a first distributed bragg reflector (DBR) layer, an active layer, a second DBR layer, and a first electrically conductive contact layer, in this order from a side of the substrate, and
    a second electrically conductive contact layer and a two-dimensional electron gas generation layer between the first DBR layer and the active layer or in the first DBR layer,
        wherein the second electrically conductive contact layer is at a position more adjacent to the active layer than the two-dimensional electron gas generation layer;
    a first electrode layer in contact with the first electrically conductive contact layer; and
    a second electrode layer in direct contact with a surface of the second electrically conductive contact layer adjacent to the active layer.

2. The surface emitting laser according to claim 1, wherein
    at least the active layer, the second DBR layer, and the first electrically conductive contact layer in the stacked structure form a mesa part having a columnar shape.

3. The surface emitting laser according to claim 1, wherein
    the stacked structure includes a non-doped GaAs layer, a non-doped AlGaAs layer, and a second electrically conductive AlGaAs layer in this order from a side adjacent to the second electrically conductive contact layer, and
    the two-dimensional electron gas generation layer is in the non-doped GaAs layer near an interface between the non-doped AlGaAs layer and the non-doped AlGaAs layer.

4. The surface emitting laser according to claim 1, wherein the stacked structure includes a non-doped GaN layer, a non-doped AlGaN layer, and a second electrically conductive AlGaN layer in this order from a side adjacent to the second electrically conductive contact layer, and
    the two-dimensional electron gas generation layer is in the non-doped GaN layer near an interface between the non-doped AlGaN layer and the non-doped AlGaN layer.

5. The surface emitting laser according to claim 1, wherein
    the first electrode layer has a ring shape with an opening at a position opposed to a light-emitting region of the active layer, and
    a surface of the second electrically conductive contact layer exposed in the opening of the first electrode layer serves as a light emitting surface of the surface emitting laser.

6. The surface emitting laser according to claim 1, wherein the stacked structure further includes a spacer layer between the active layer and the second DBR layer, and
    a current constriction layer provided in the second DBR layer or between the second DBR layer and the spacer layer, the current constriction layer comprising:
    a current injection region including a p-type semiconductor; and
    a current constriction region including an insulating material formed by oxidizing an AlAs layer in a peripheral region of the current injection region.

7. The surface emitting laser according to claim 1, wherein the substrate is a semi-insulating GaAs substrate.

8. The surface emitting laser according to claim 1, wherein
    the first DBR layer is thicker than the second DBR layer, and
    the second DBR layer has a lower refractive index than the first DBR layer with respect to an oscillation wavelength of the surface emitting laser.

* * * * *